(12) United States Patent
Duffy

(10) Patent No.: US 6,665,360 B1
(45) Date of Patent: Dec. 16, 2003

(54) DATA TRANSMITTER WITH SEQUENTIAL SERIALIZATION

(75) Inventor: Michael L. Duffy, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/466,652

(22) Filed: Dec. 20, 1999

(51) Int. Cl.[7] .............................. H04B 1/38; H04L 7/00
(52) U.S. Cl. ..................................... 375/354; 375/220
(58) Field of Search .................................. 375/354–375

(56) References Cited

U.S. PATENT DOCUMENTS

| | | | | |
|---|---|---|---|---|
| 4,644,346 A | * | 2/1987 | Ito et al. ..................... | 370/366 |
| 5,572,721 A | * | 11/1996 | Rostamian ................... | 713/500 |
| 5,602,882 A | * | 2/1997 | Co et al. ..................... | 375/372 |
| 5,668,830 A | * | 9/1997 | Georgiou et al. ............ | 375/220 |
| 5,905,388 A | * | 5/1999 | Van Der Valk et al. ..... | 327/107 |
| 2002/0114416 A1 | * | 8/2002 | Enam et al. ................. | 375/373 |

OTHER PUBLICATIONS

A 1.0625Gbps Transceiver with 2x–Oversampling and Transmit Signal Pre–Emphasis, by Alan Fiedler et al., ISSCC97/Session 15/Serial Data Communications/Paper FP 15.1, 1997, pp. 238–239, 464.

A 2.125–Gb/s BiCMOS Fiber Channel Transmitter for Serial Data Communications, by Muneo Fukaishi et al., IEEE Journal of Sold–State Circuits, vol. 34, No. 9, Sep. 1999, pp. 1325–1329.

* cited by examiner

Primary Examiner—Stephen Chin
Assistant Examiner—Lawrence Williams
(74) Attorney, Agent, or Firm—Christopher P. Maiorana, P.C.

(57) ABSTRACT

An apparatus comprising a first circuit, a second circuit and a third circuit. The first circuit may be configured to generate (i) a first control signal, (ii) a second control signal, (iii) one or more first clock signals and (iv) a first data signal operating at a first speed in response to (i) an input data signal and (ii) a reference clock signal. The second circuit may be configured to generate one or more intermediate data signals operating at a second speed in response to (i) the first control signal, (ii) the one or more first clock signals and (iii) the first data signal. The third circuit may be configured to generate an output data signal operating at a third speed in response to (i) the second control signal and (ii) the one or more intermediate data signals.

18 Claims, 13 Drawing Sheets

US 6,665,360 B1

DATA TRANSMITTER WITH SEQUENTIAL SERIALIZATION

FIELD OF THE INVENTION

The present invention relates to a method and/or architecture for data transmission with sequential serialization generally and, more particularly, to a method of data transmission that may improve efficiency and precision.

BACKGROUND OF THE INVENTION

A transceiver is a device that implements a transmitter and a receiver. The efficiency and precision of a transceiver device is significantly dependent on the transmitter implementation.

Referring to FIG. 1, a block diagram illustrating a conventional transmitter 10 is shown. The transmitter 10 may be implemented as part of a transceiver device. The transmitter 10 comprises a full rate phase-locked loop 12, a bit rate counter 14, a high speed shifter 16 and an input register 18. The transmitter 10 has high power consumption due to the implementation of the full rate phase locked loop 12, the high speed counter 14 and the high speed shifter 16.

Referring to FIG. 2, a block diagram of a second conventional transmitter 10' is shown. The transmitter 10' may be implemented as part of a transceiver device. The transmitter 10' comprises a 1/T rate phase-locked loop 12', a select generator 15, a multiplexer output block 17 and an input register 18'. The transmitter 10' has lower power consumption than the transmitter 10 due to parallel operation. However, the transmitter 10' suffers from jitter injected due to a mismatch in the select generator 15. Jitter is additionally injected due to a mismatch between the large number of stages in the multiplexer output block 17.

Referring to FIG. 3, a circuit diagram of a third conventional transmitter 10" is shown. The transmitter 10" may be implemented as part of a transceiver device. The transmitter 10" comprises a plurality of 2 to 1 multiplexers 20a–20n, a first plurality of D-type flip-flops 22a–22n and a second plurality of D-type flip-flops 24a–24n. The transmitter 10" implements two half rate shift registers groups (i) the flip-flops 22a–22n and (ii) the flip-flops 24a–24n (as opposed to one full rate shift register). The power consumption of this method is still unnecessarily high, since the serial shift can be avoided.

SUMMARY OF THE INVENTION

The present invention concerns an apparatus comprising a first circuit, a second circuit and a third circuit. The first circuit may be configured to generate (i) a first control signal, (ii) a second control signal, (iii) one or more first clock signals and (iv) a first data signal operating at a first speed in response to (i) an input data signal and (ii) a reference clock signal. The second circuit may be configured to generate one or more intermediate data signals operating at a second speed in response to (i) the first control signal, (ii) the one or more first clock signals and (iii) the first data signal. The third circuit may be configured to generate an output data signal operating at a third speed in response to (i) the second control signal and (ii) the one or more intermediate data signals.

The objects, features and advantages of the present invention include providing a method and/or architecture that may (i) reduce power consumption, (ii) reduce jitter by minimizing the number of parallel elements, (iii) reduce jitter resulting from a mismatch between parallel elements, (iv) allow a single VCO phase to control serialization and/or (v) reduce mismatch issues related to one or more control signals.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
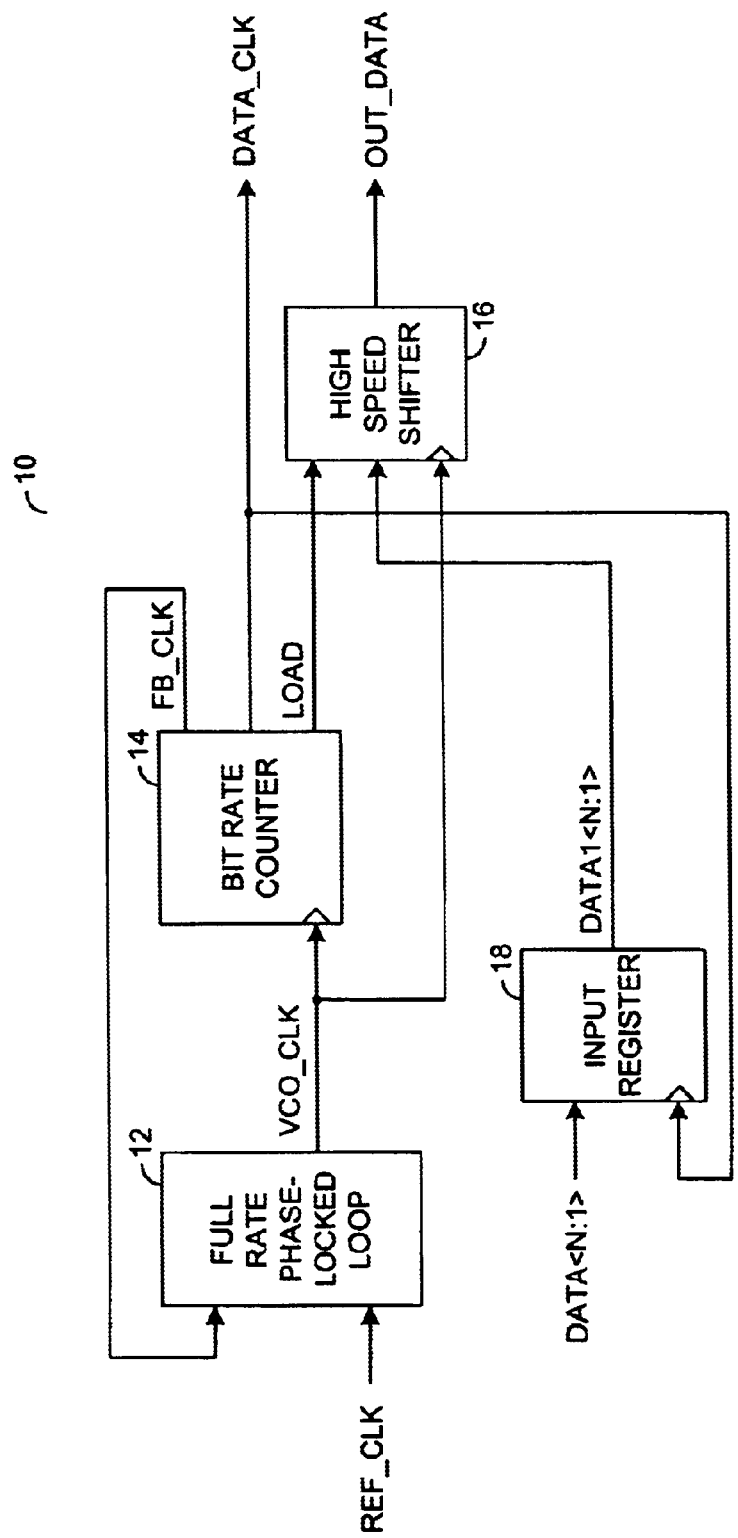
FIG. 1 is a block diagram of a conventional transmitter.
Figure 2:
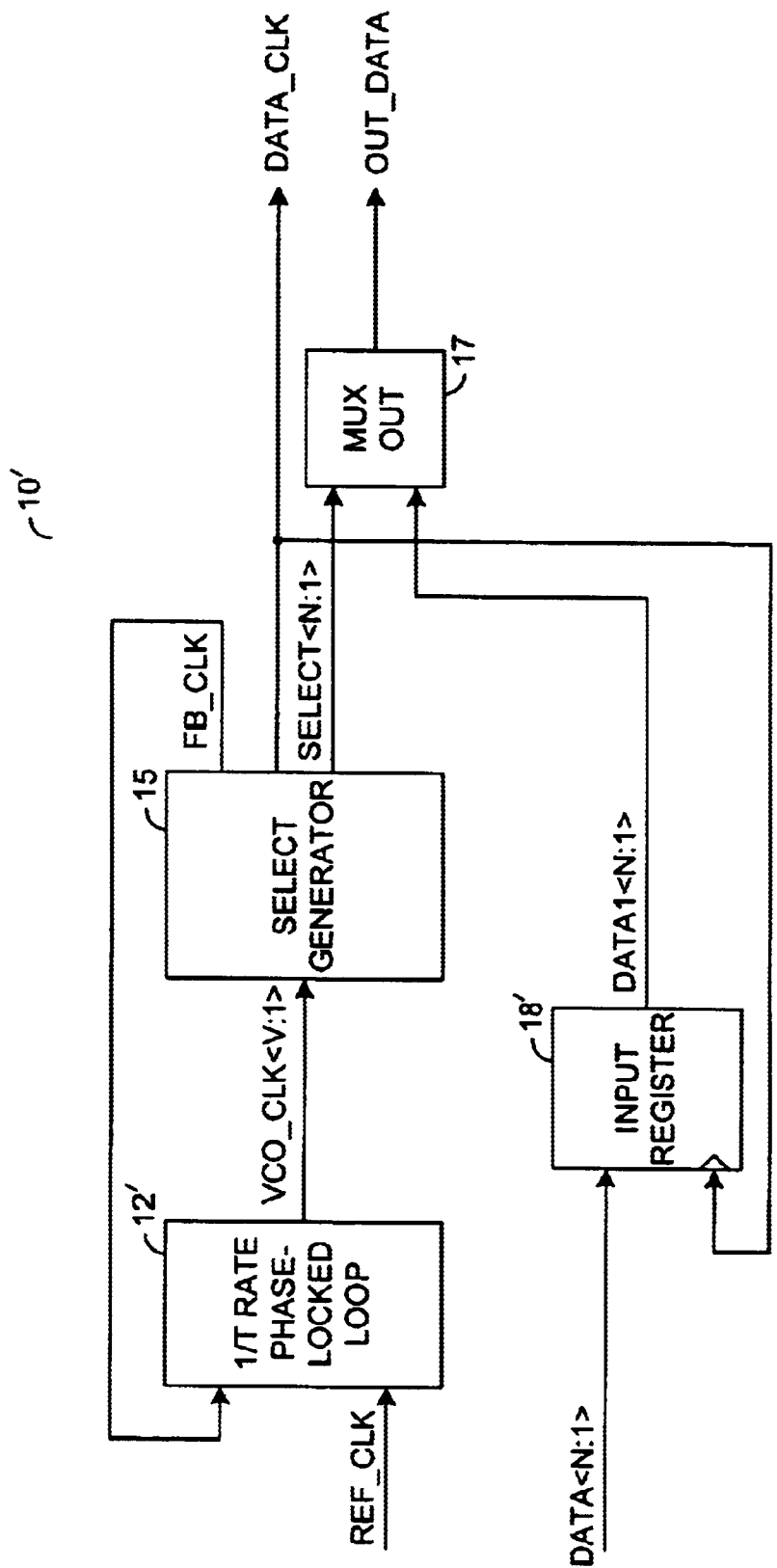
FIG. 2 is a block diagram of a conventional transmitter.
Figure 3:
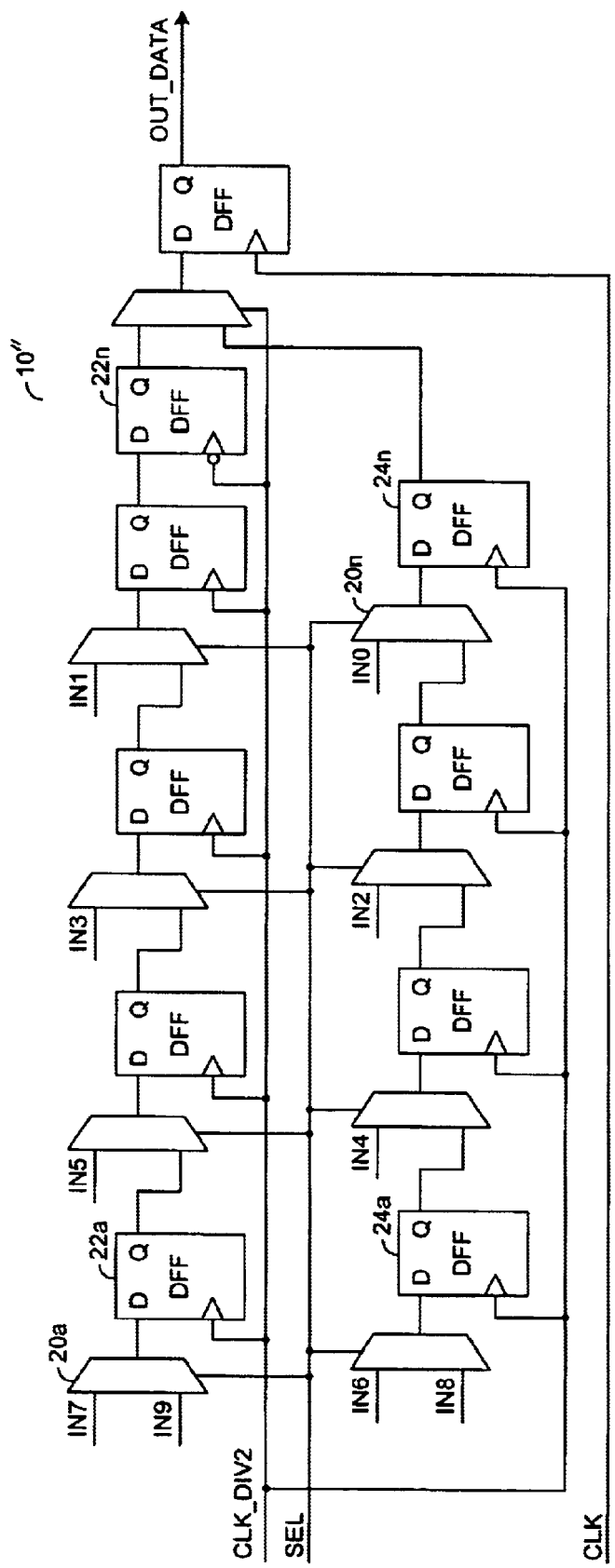
FIG. 3 is a block diagram of a conventional transmitter.
Figure 4:
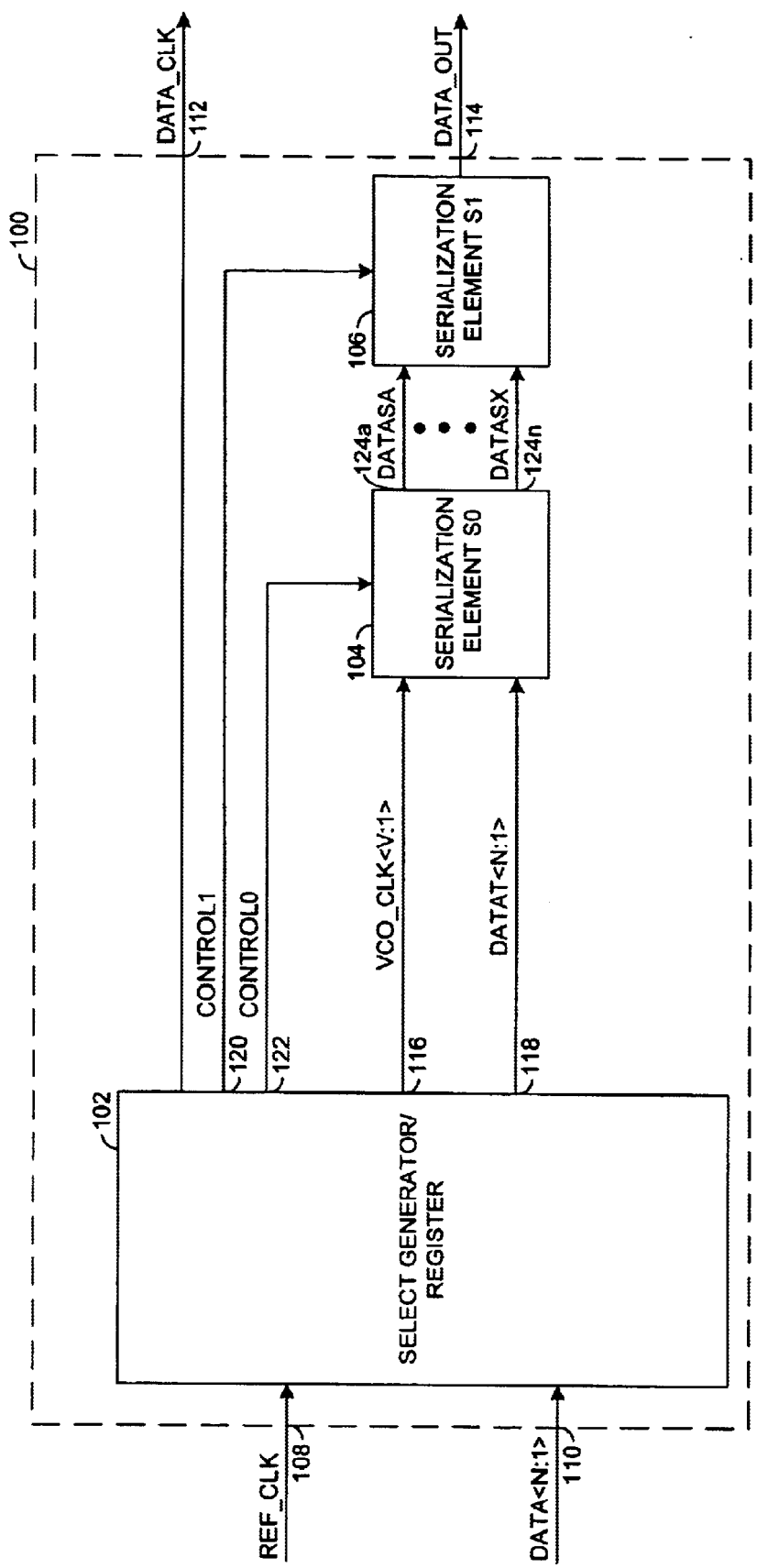
FIG. 4 is a block diagram of a preferred embodiment of the present invention.

Referring to FIG. 4, a block diagram of a circuit 100 is shown in accordance with a preferred embodiment of the present invention. In one example, the circuit 100 may be a transmitter which may be implemented as part of a transceiver device. The transmitter 100 generally comprises a select block (or circuit) 102, a serialization block (or circuit) 104 and a serialization block (or circuit) 106. In one example, the select circuit 102 may be implemented as a select generator/register and the serialization circuits 104 and 106 may each be implemented as a serialization element circuit. The transmitter 100 may have an input 108 that may receive a clock signal (e.g., REF_CLK) and an input 110 that may receive a data signal (e.g., DATA<N:1>). The signal DATA<N:1> may be implemented as an n-bit signal, where n is an integer. The transmitter 100 may have an output 112 that may present a clock signal (e.g., DATA_CLK). The signal DATA_CLK may be presented in response to the signal REF_CLK. The signal DATA_CLK may be implemented as a low speed clock output signal. The transmitter 100 may have an output 114 that may present a data signal (e.g., DATA_OUT). The signal DATA_OUT may be presented in response to the signal REF_CLK and the data signal DATA<N:1>.

The select circuit 102 may have an output 116 that may present a clock signal (e.g., VCO_CLK<V:1>). The clock signal VCO_CLK<V:1> may be presented to the serialization circuit 104. The clock signal VCO_CLK<V:1> may be implemented as an internal high speed clock signal. The select circuit 102 may increase the frequency of the signal REF_CLK to generate the internal high speed clock signal VCO_CLK<V:1>. The select circuit 102 may reduce the frequency of the internal high speed clock signal VCO_CLK<V:1> to generate the low speed clock output signal DATA_CLK. The signal VCO_CLK<V:1> may be n-bit wide, where n is an integer. The select circuit 102 may have an output 118 that may present a data signal (e.g., DATAT<N:1>) in response to the signal REF_CLK and the signal DATA<N:1>. The signal DATAT<N:1> may be implemented as a low speed n-bits wide parallel data stream, where n is an integer. The select circuit 102 may have an output 120 that may generate a control signal (e.g., CONTROL1) in response to the signal REF_CLK. The select circuit 102 may have an output 122 that may generate a control signal (e.g., CONTROL0) in response to the signal REF_CLK.

The serialization circuit 104 may have a plurality of outputs 124a–124n that may present a plurality of data signals (e.g., DATASA–DATASN). The data signals DATASA–DATASN may be implemented as a number of internal intermediate speed data streams. The signals DATASA–DATASN may be generated in response to the signal VCO_CLK<V:1>, the signal DATAT<N:1> and the signal CONTROL0. The serialization circuit 104 may convert the low speed parallel data stream DATAT<N:1> into the number of intermediate speed data streams DATASA–DATASN. In one example, a 16 bit, 155.5 Mb/s parallel data stream may be converted into two 1244 Mb/s data streams. However, other conversions may be implemented accordingly to meet the design criteria of a particular implementation.

The serialization circuit 106 may convert the internal intermediate speed data streams DATASA–DATASN into the serial data output stream DATA_OUT. The signal DATA_OUT may be generated in response to the plurality of signals DATASA–DATASN and the signal CONTROL1. The serialization circuit 106 may convert one or more intermediate speed data streams DATASA–DATASN into a single high speed output (DATA_OUT). In one example, two 1244 Mb/s data streams may be converted into a single 2488 Mb/s data stream. Jitter injected by the serialization circuit 104 may not affect the signal DATA_OUT, because the intermediate signals DATASA–DATASN are generally retimed by the serialization circuit 106. However, jitter injected by the serialization circuit 106 may affect the DATA_OUT signal. Therefore the architecture and design of the serialization circuit 106 is generally more critical than the serialization circuit 104. A typical design of the serialization circuit 106 may limit the number of data inputs to either 2 or 4 in order to minimize jitter resulting from a mismatch between the data inputs and/or a mismatch between a number of control signals.

Figure 5:
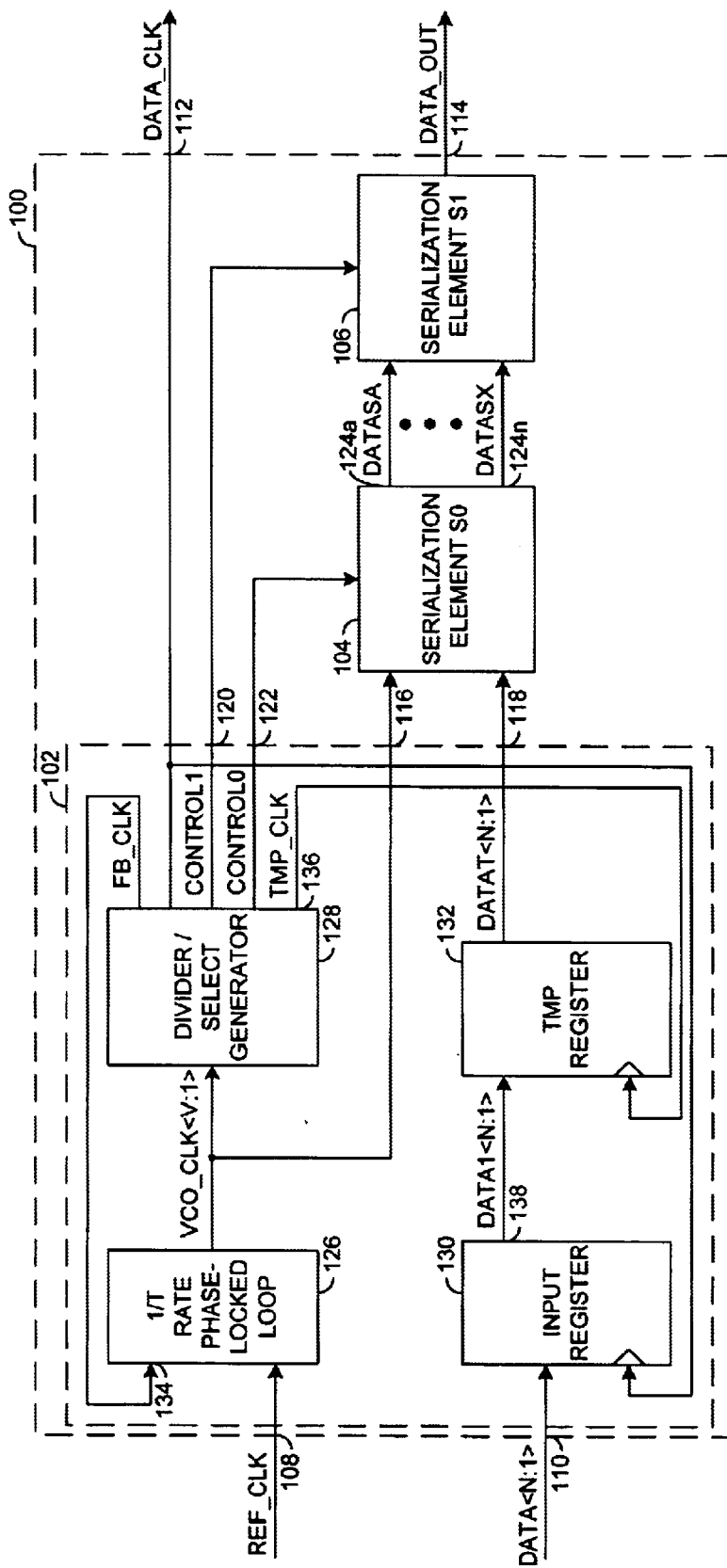
FIG. 5 is a detailed block diagram illustrating a select generator/register block of FIG. 4.

Referring to FIG. 5, a detailed block diagram of the select circuit 102 is shown. The select circuit 102 generally comprises a phase-locked loop block (or circuit) 126, a generator block (or circuit) 128, a register 130 and a register 130. The phase-locked loop 126 may be implemented as a 1/T rate phase-locked loop. The generator circuit 128 may be implemented as a divider/select generator. In one example, the register 130 may be an input register and the register 132 may be a temporary register. However, other types of phase-locked loops and/or registers may be implemented to meet the design criteria of a particular application.

The phase-locked loop 126 may have an input 134 that may receive a feedback clock signal (e.g., FB_CLK). The phase-locked loop 126 may present the signal VCO_CLK<V:1> to the serialization circuit 104 and the generator circuit 128. The phase-locked loop 126 may generate the signal VCO_CLK<V:1> in response to the signal REF_CLK and the signal FB_CLK. The phase-locked loop 126 may be implemented to multiply the incoming low speed signal REF_CLK up to the high speed clock signal VCO_CLK. In one implementation, for a 2488 Mb/s data rate, the signal REF_CLK may be 155.5 MHz and VCO_CLK may be 1244 MHz. However, other speeds may be implemented accordingly to meet the design criteria of a particular implementation.

The generator circuit 128 may generate the signal FB_CLK and the signal DATA_CLK in response to the signal VCO_CLK<V:1>. The generator circuit 128 may generate the signal CONTROL0 and the signal CONTROL1 in response to the signal VCO_CLK<V:1>. The generator circuit 128 may have an output 136 that may generate a clock signal (e.g., TMP_CLK) in response to the signal VCO_CLK<V:1>. In one implementation, a rotating "1" counter may be implemented to allow generation of the signal CONTROL0 and the signal CONTROL1 at the same frequency as the signal FB_CLK without the need for additional decode logic. In one implementation the signal FB_CLK may be stretched into a 50% duty cycle clock signal for design considerations elsewhere.

The register 130 may have an output 138 that may present a data signal (e.g., DATA1<N:1>) in response to the signal DATA<N:1> and the signal DATA_CLK. The register 130 may retime the data signal DATA<N:1> to the signal DATA_CLK. The register 132 may generate the signal DATAT<N:1> in response to the signal DATA1<N:1> and the signal DATA_CLK. The register 132 may be implemented to resolve timing issues and ease the transfer of data to the serialization circuit 104.

Figure 6:
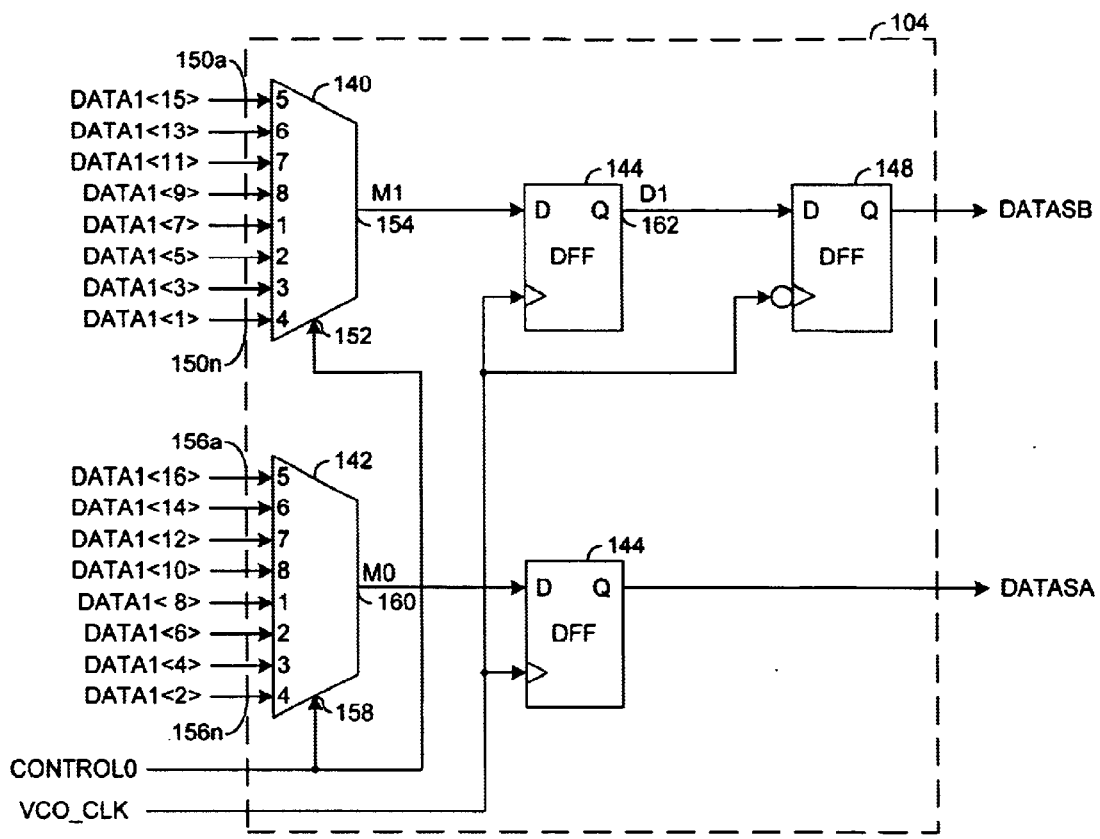
FIG. 6 is a detailed block diagram illustrating a serialization block of FIG. 4.

Referring to FIG. 6, a circuit diagram of the serialization circuit 104 is illustrated. The serialization circuit 104 generally comprises a multiplexer 140, a multiplexer 142, a flip-flop 144, a flip-flop 146 and an optional flip-flop 148. In one example, the multiplexers 140 and 142 may be 8 to 1 multiplexers and the flip-flops 144–148 may be D-type flip-flops. However, other types of multiplexers and/or flip-flops may be implemented to meet the design criteria of a particular application.

The multiplexer 140 may have a plurality of inputs 150a–150n that may receive the odd numbered bits of the signal DATA<1:16> (e.g., the signals DATA<1>, DATA<3>, ... DATA<15>). The multiplexer 140 may have a select input 152 that may receive the may present a data signal (e.g., M1) in response to the odd numbered DATA1 bits and the signal CONTROL0.

The multiplexer 142 may have a plurality of inputs 156a–156n that may receive the even numbered bits of the signal DATA<1:16> (e.g., the signals DATA<2>, DATA<4>, ... DATA<16>). The multiplexer 142 may have a select input 158 that may receive the signal CONTROL0. The multiplexer 142 may have an output 160 that may present a data signal (e.g., M0) in response to the even numbered DATA1 bits and the signal CONTROL0.

The flip-flop 144 may have an output 162 that may present a data signal (e.g., D1) in response to the signal M1 and the signal VCO_CLK. The flip-flop 146 may generate the signal DATASA in response to the signal M0 and the signal VCO_CLK. The flip-flop 148 may generate the signal DATASB in response to the signal D1 and the signal VCO_CLK.

Figure 7:
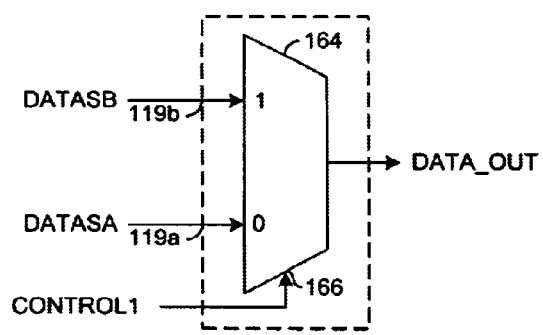
FIG. 7 is a detailed block diagram illustrating a serialization block of FIG. 4.

Referring to FIG. 7, a circuit diagram of the serialization circuit 106 is shown. The serialization circuit 106 generally comprises a multiplexer 164. In one example, the multiplexer 164 may be a 2 to 1 multiplexer. However, other types of multiplexers may be implemented to meet the design criteria of a particular application. The multiplexer 164 may have an input 166 that may receive the signal CONTROL1. The multiplexer 164 may generate the signal DATA_OUT in response to the signals DATASA, DATASB and CONTROL1.

Figure 8:
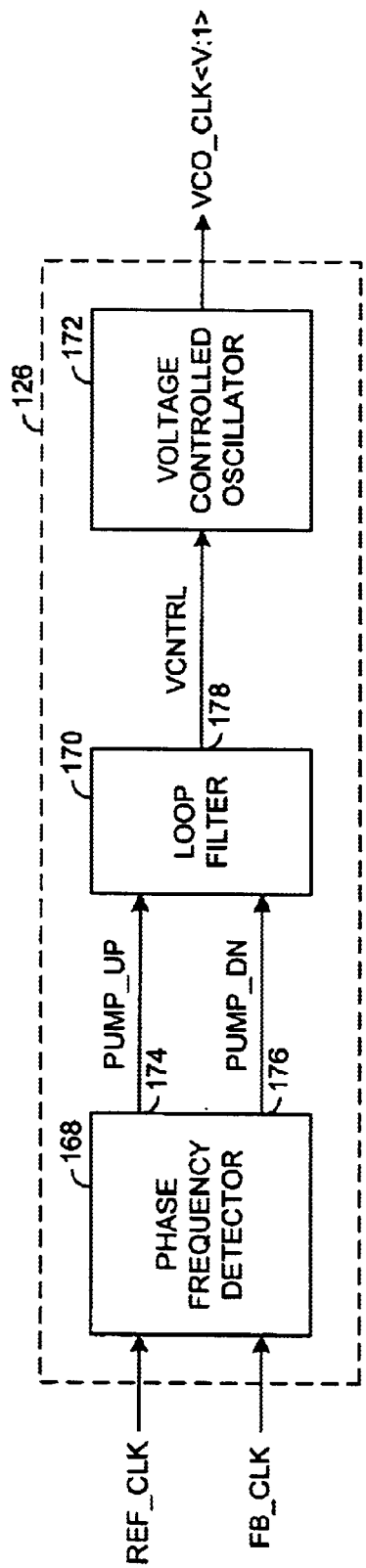
FIG. 8 is a detailed block diagram illustrating a phase locked loop of FIG. 5.

Referring to FIG. 8, a detailed block diagram of the phase-locked loop 126 is shown. The phase-locked loop 126 generally comprises a detector circuit 168, a filter circuit 170 and a VCO 172. In one example, the detector circuit 128 may be a phase frequency detector and the filter circuit 170 may be a loop filter.

The detector circuit 128 may have an output 174 that may present a control signal (e.g., PUMP_UP) in response to one or more of the signals REF_CLK and/or FB_CLK. The detector circuit 128 may have an output 174 that may present a control signal (e.g., PUMP_DN) in response to one or more of the signals REF_CLK and/or FB_CLK. The filter circuit 170 may have an output 178 that may present a control signal (e.g., VCNTRL) in response to one or more of the signals PUMP_UP and PUMP_DN. The VCO 172 may generate the signal VCO_CLK<V:1> in response to the signal VCNTRL.

Figure 9:
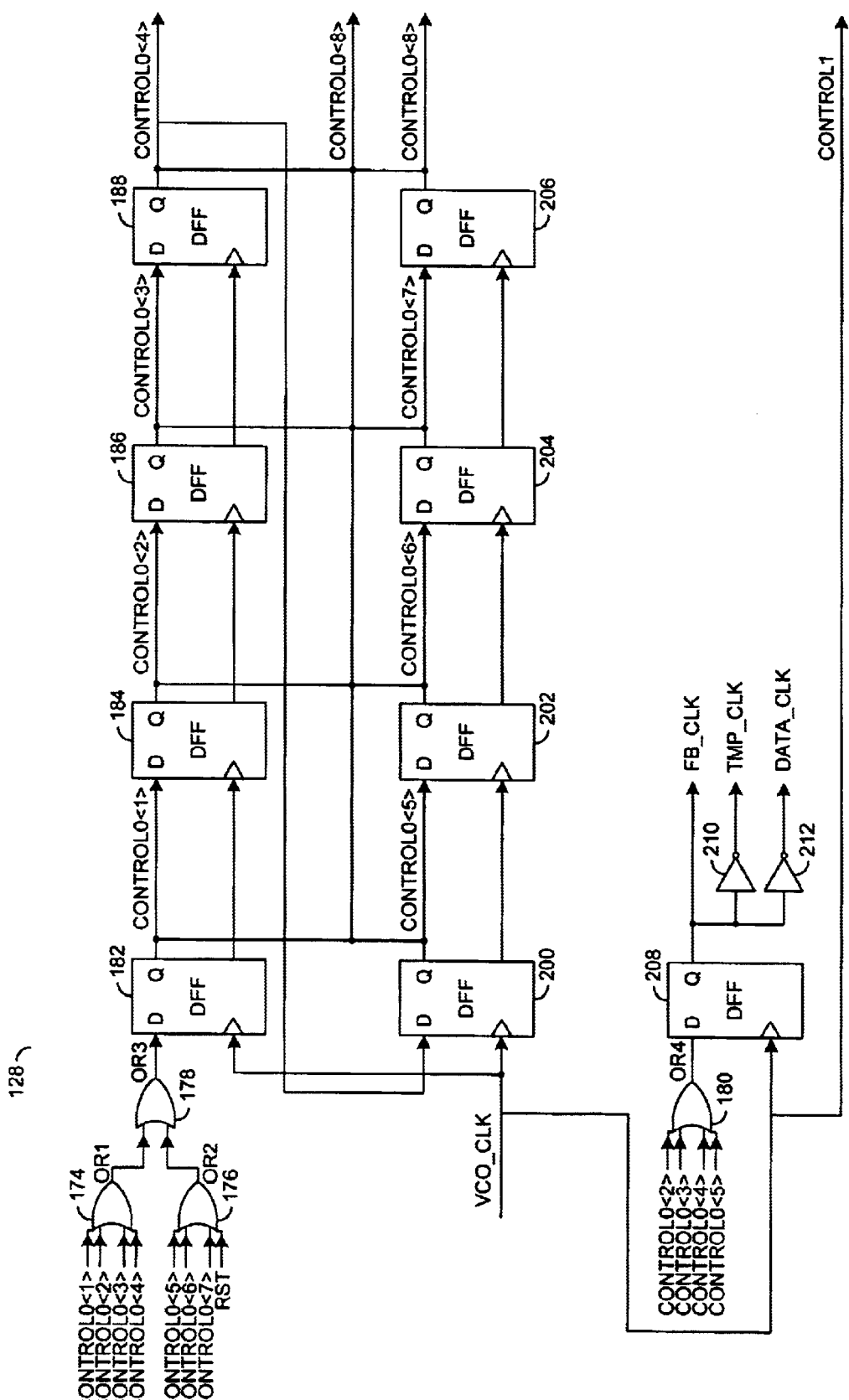
FIG. 9 is a detailed block diagram illustrating a divider/select generator of FIG. 5.

Referring to FIG. 9, a circuit diagram of the generator circuit 128 is shown. The generator circuit 128 generally comprises a number of logic gates 174–180, a number of flip-flops 182–208, an inverter 210 and a buffer 212. In one example, the logic gates 174–180 may be implemented as 4 input OR gates and the flip-flops 182–208 may be implemented as D-type flip-flops. However, other types of logic gates and/or flip-flops may be implemented to meet the design criteria of a particular application.

The logic gate 174 may be configured to generate a control signal (e.g., OR1) in response to the signals CONTROL0<1>–CONTROL0<4>. The logic gate 176 may generate a control signal (e.g., OR2) in response to the signals CONTROL0<5>–CONTROL0<7>. The control signal OR2 may be optionally presented in response to an optional reset signal (e.g., RST). The logic gate 178 may generate a control signal (e.g., OR3) in response to the signal OR1 and the signal OR2. The logic gate 180 may generate a control signal (e.g., OR4) in response to the signals CONTROL0<2>–CONTROL0<5>.

The flip-flop 182 may be configured to generate the signal CONTROL0<1> in response to the signals OR3 and VCO_CLK. The flip-flop 184 may be configured to generate the signal CONTROL0<2> in response to the signals CONTROL0<1> and VCO_CLK. The flip-flop 186 may be configured to generate the signal CONTROL0<3> in response to the signal CONTROL0<2> and the signal VCO_CLK. The flip-flop 188 may be configured to generate the signal CONTROL0<4> in response to the signal CONTROL0<3> and the signal VCO_CLK. The flip-flop 200 may be configured to generate the signal CONTROL0<5> in response to the signal CONTROL0<4> and the signal VCO_CLK. The flip-flop 202 may be configured to generate the signal CONTROL0<6> in response to the signal CONTROL0<5> and the signal VCO_CLK. The flip-flop 204 may be configured to generate the signal CONTROL0<7> in response to the signal CONTROL0<6> and the signal VCO_CLK. The flip-flop 206 may be configured to generate the signal CONTROL0<8> in response to the signal CONTROL0<7> and the signal VCO_CLK. The output 122 may be connected to each of the signals CONTROL0<1>–CONTROL0<8>.

The flip-flop 208 may be configured to generate the signal FB_CLK in response to the signal OR4 and the signal VCO_CLK. The signal FB_CLK may be presented to the inverter 210 and the buffer 212. The inverter 210 may generate the signal TMP_CLK in response to the signal FB_CLK. The buffer 212 may generate the signal DATA_CLK in response to the signal FB_CLK. The signal VCO_CLK may be presented to the output 120 as the signal CONTROL1.

Figure 10:
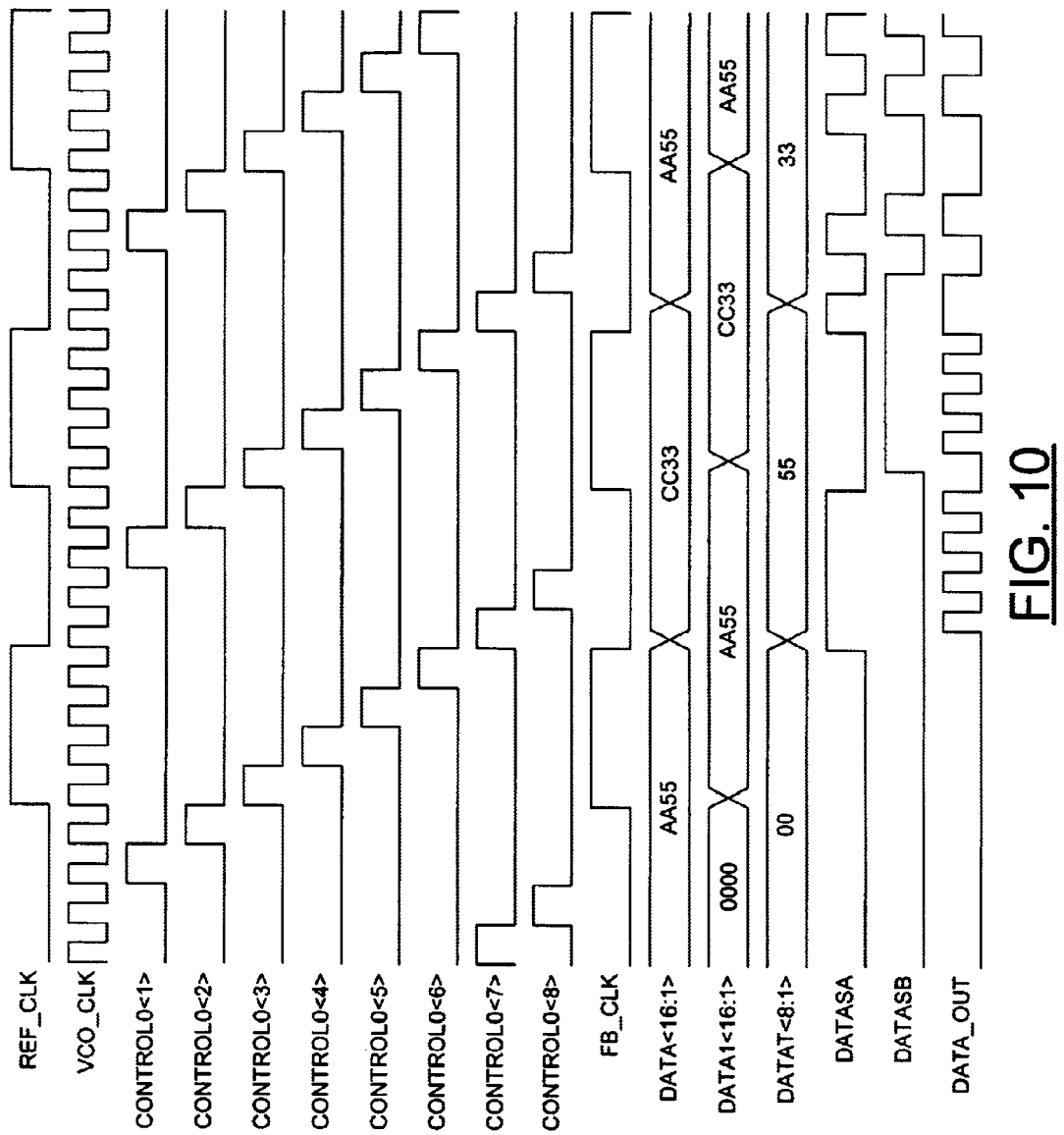
FIG. 10 is a timing diagram illustrating the operation of the present invention.

Referring to FIG. 10 a timing diagram of the transmitter 100 is illustrated. In one example, the frequency of the signal REF_CLK may be multiplied to create the internal high speed clock VCO_CLK. The control signals CONTROL0<N:1> are generally all timed to a clock edge of the signal VCO_CLK. The signal FB_CLK may be generated by dividing down the frequency of the signal clock VCO_CLK. The signal DATA1<N:1> is generally timed to the signal FB_CLK. The signal DATAT<N:1> may be a low speed data stream timed to the signal FB_CLK. The signals DATA1<N:1> and DATAT<N:1> may then be converted to one or more intermediate speed signals depicted as the signals DATASA and DATASB. The intermediate speed data streams DATASA and DATASB then may be converted to the single high speed output DATA_OUT.

Figure 11:
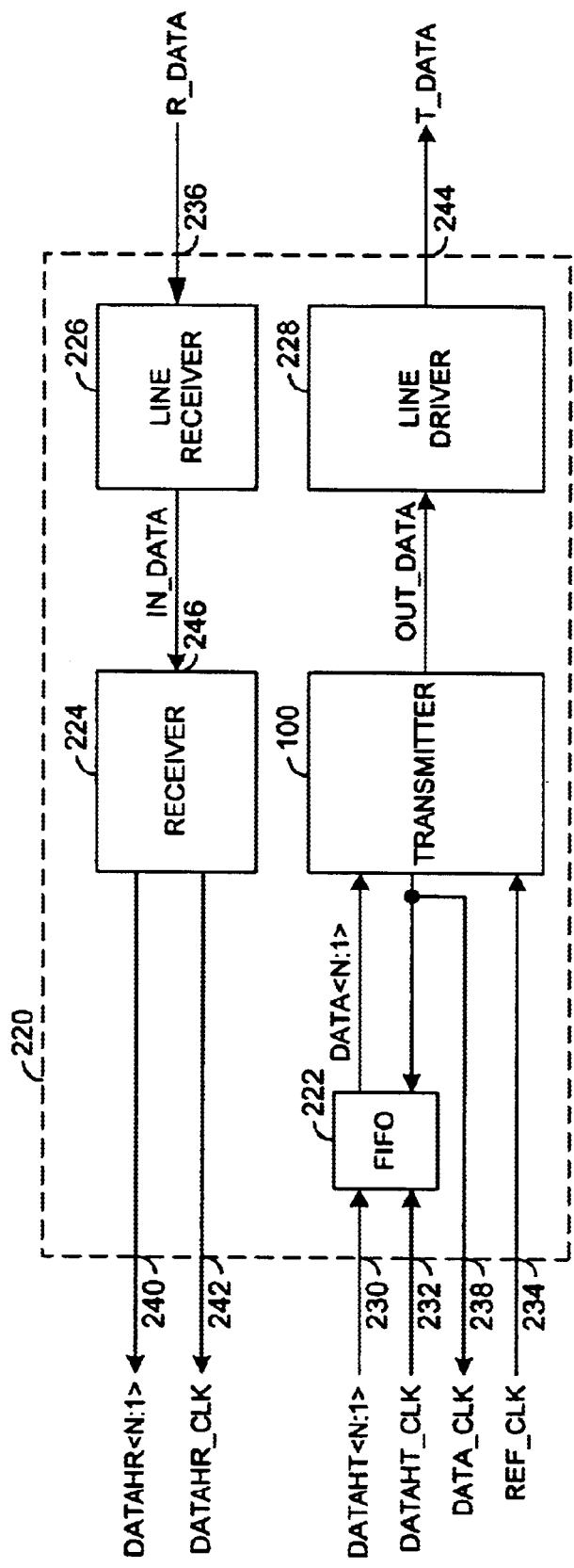
FIG. 11 is a block diagram of a preferred embodiment of the present invention implemented as part of a transceiver.

Referring to FIG. 11, a block diagram of the transmitter 100 implemented as part of a transceiver device 220 is illustrated. The transmitter 100 is generally shown implemented as part of a transceiver. The transceiver device 220 may also, in one example, comprise a FIFO 222, a receiver 224, a line receiver 226 and a line driver 228. The transceiver 220 may have an input 230 that may receive a signal (e.g., DATAHT<N:1>), an input 232 that may receive a signal (e.g., DATAHT_CLK), an input 234 that may receive the signal REF_CLK and an input 236 that may receive a signal (e.g., R_DATA). The signal DATAHT<N:1> may be n-bits wide, where n is an integer. The transceiver 220 may have an output 238 that may present the signal DATA_CLK in response to one or more of the signals DATAHT<N:1>, DATAHT_CLK and REF_CLK. The transceiver 220 may have an output 240 that may present a signal (e.g., DATAHR<N:1>) in response to the signal R_DATAT. The signal DATAHR<N:1> may be n-bits wide, where n is an integer. The transceiver 220 may have an output 242 that may present a signal DATAHR_CLK in response to the signal R_DATA. The transceiver 220 may have an output 244 that may present a signal T_DATA in response to one or more of the signals DATAHT<N:1>, DATAHT_CLK and REF_CLK. The low power consumption of the transmitter 100 may enhance the overall efficiency of the transceiver. By reducing the jitter of the transmitter 100, the transceiver may be more precise.

The FIFO 222 may generate the signal DATA<N:1> in response to the signals DATAHT<N:1> and DATAHT_CLK. The receiver 224 may have an input 246 that may receive a signal IN_DATA. The receiver 224 may generate the signals DATAHR<N:1> and DATAHR_CLK in response to the signal IN_DATA. The line receiver 226 may generate the signal IN_DATA in response to the signal R_DATA. The line driver 228 may generate the signal T_DATA in response to the signal OUT_DATA.

Figure 12:
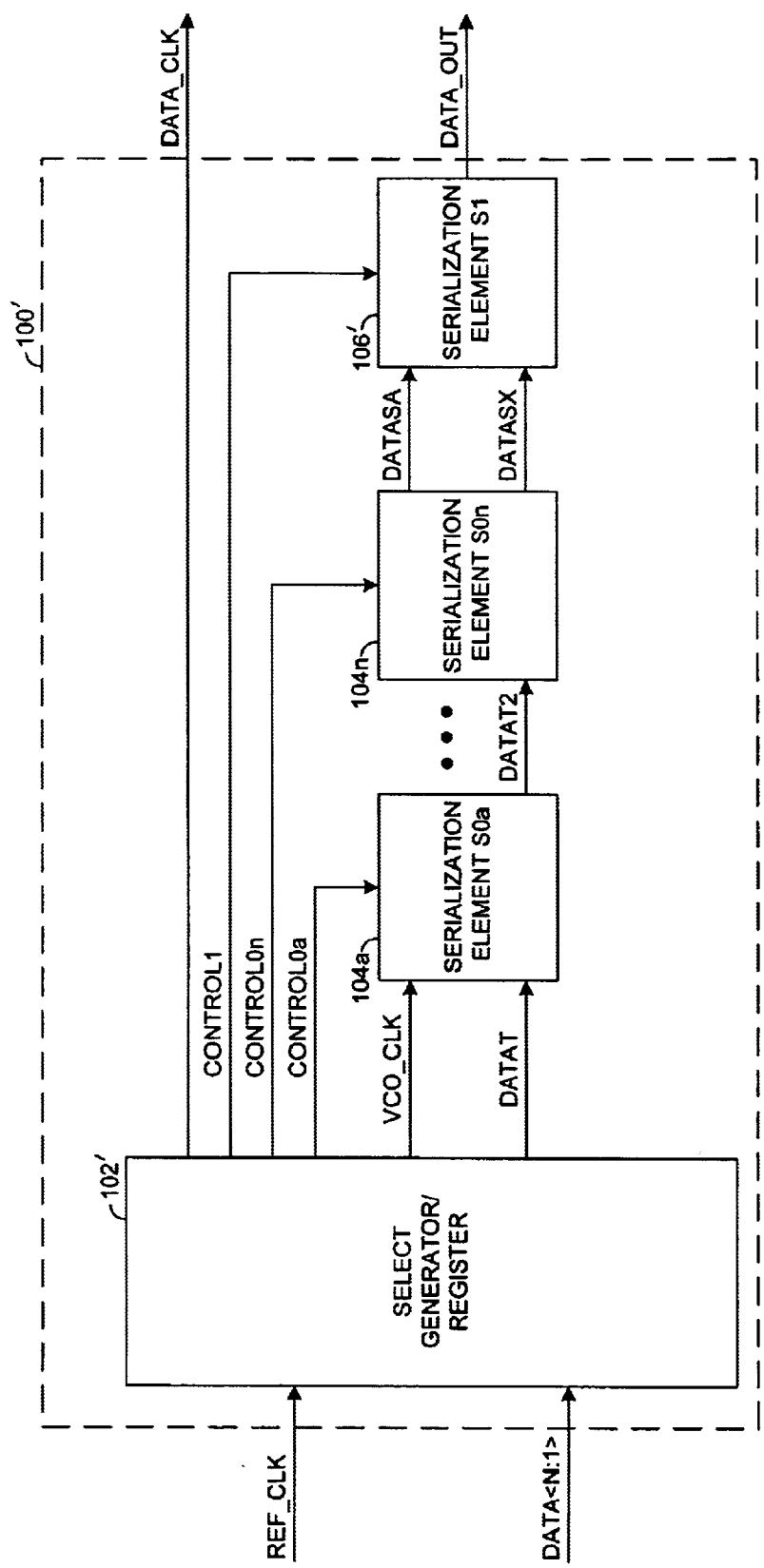
FIG. 12 is a block diagram of an alternate embodiment of the present invention.

Referring to FIG. 12, an alternate embodiment of a transmitter 100' is illustrated. The transmitter 100' may be similar to the transmitter 100 and may comprise similar components, marked with prime notation. However, the transmitter 100' may implement three or more serialization stages represented by the circuits 104a'–104n' and 106'. At very high speeds of operation (5–10 GHz), it may be more practical to implement three or more serialization stages due to the potential difficulty of designing a very wide (20 bits or more) serialization element.

Figure 13:
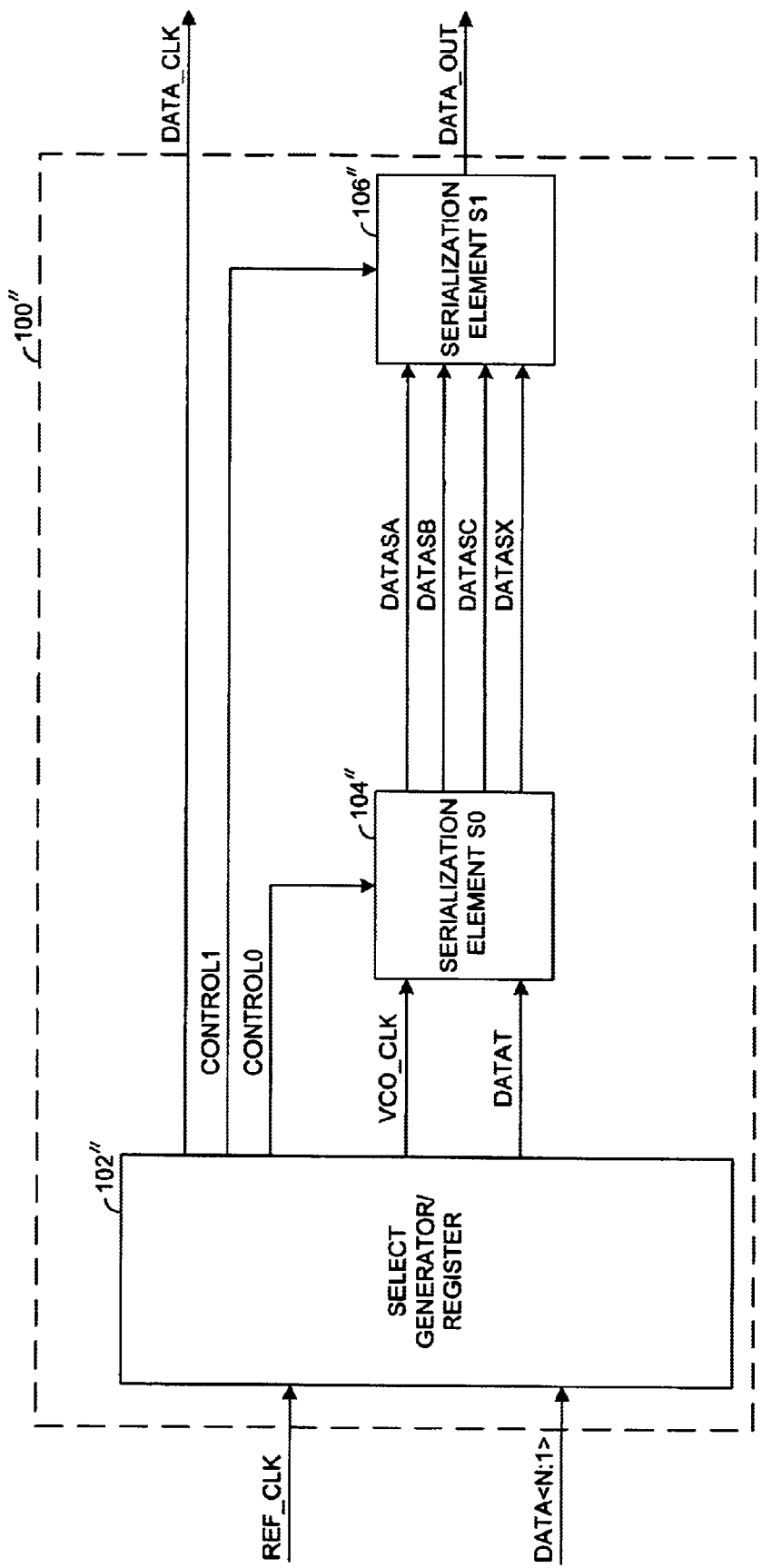
FIG. 13 is a block diagram of an alternate embodiment of the present invention.

Referring to FIG. 13, an alternate embodiment of a transmitter 100" is illustrated. The transmitter 100" may be similar to the transmitter 100 and may comprise similar components, marked with double prime notation. However, the serialization circuit 106" may be implemented with 4 data inputs whereas the serialization circuit 106 may be implemented with 2 data inputs.

The 4 data input serialization circuit 106" may provide lower power consumption. However the 4 data input serialization circuit 106" may contribute more jitter. The 4 input configuration may be a good solution for power sensitive applications in the 3–5 GHz range.

Figure 14:
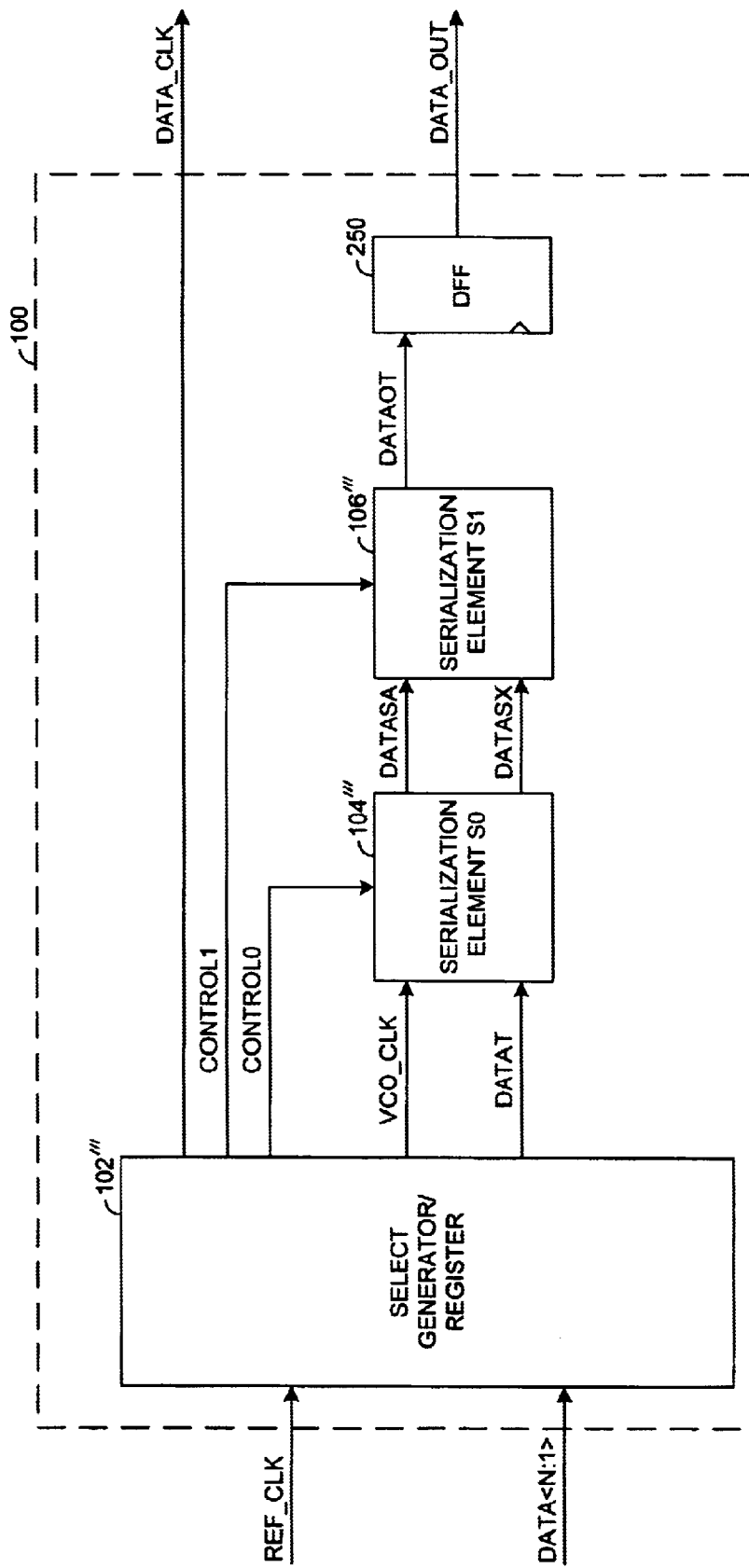
FIG. 14 is a block diagram of an alternate embodiment of the present invention.

Referring to FIG. 14, an alternate embodiment of the transmitter 100''' is illustrated. The transmitter 100''' may be similar to the transmitter 100 and may comprise similar components, marked with triple prime notation. However, the circuit 100''' may implement a bit rate D-type flip-flop 250 to retime the output of the serialization circuit 106'''.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate (i) one or more first control signals, (ii) one or more second control signals, (iii) one or more first clock signals and (iv) a first data signal operating at a first speed in response to (i) an input data signal and (ii) a reference clock signal;
   a first serialization element configured to generate one or more intermediate data signals operating at a second speed in response to (i) said one or more first control signals, (ii) said one or more first clock signals and (iii) said first data signal; and
   a second serialization element comprising a multiplexer configured to generate an output data signal operating at a third speed in response to (i) said one or more second control signals and (ii) one or more intermediate data signals operating at a second speed.

2. The apparatus according to claim 1, wherein said first circuit is further configured to generate a data clock signal in response to (i) said input data signal and (ii) said reference clock signal.

3. The apparatus according to claim 1, wherein said first serialization element further comprises one or more multiplexers and one or more flip-flops.

4. The apparatus according to claim 1, wherein said first circuit comprises a phase locked loop configured to generate said one or more first clock signals in response to said reference clock signal and a feedback clock signal.

5. The apparatus according to claim 2, wherein said first circuit further comprises an input register configured to generate a second data signal in response to said input data signal and said data clock signal.

6. The apparatus according to claim 5, wherein said first circuit further comprises a divider/select generator configured to generate (i) said one or more first control signals, (ii) said one or more second control signals and (iii) said feedback clock signal in response to said one or more first clock signals.

7. The apparatus according to claim 4, wherein said phase locked loop comprises a fractional rate phase locked loop.

8. The apparatus according to claim 6, wherein said first circuit further comprises a temporary register configured to generate said first data signal in response to (i) said second data signal and (ii) a second clock signal.

9. The apparatus according to claim 6, wherein said divider/select generator further comprises a rotating 1 counter wherein said rotating 1 counter comprises a plurality of flip-flops and one or more logic gates.

10. The apparatus according to claim 7, wherein said phase locked loop (PLL) comprises:
    a phase frequency detector configured to generate a third and a fourth control signal in response to said reference clock signal and said feedback clock signal;
    a loop filter configured to generate a fifth control signal in response to said third control signal and said fourth control signal; and
    a VCO configured to generate said one or more first clock signals in response to said fifth control signal.

11. The apparatus according to claim 2, wherein:
    said apparatus is configured to present said data clock signal to a first in first out register; and
    said first in first out register is configured to generate said input data signal.

12. The apparatus according to claim 1, wherein said apparatus comprises three or more serialization elements.

13. The apparatus according to claim 1, wherein said second serialization element has four inputs.

14. The apparatus according to claim 1, wherein said first serialization element further comprises one or more flip-flops that operate on a first edge of said one or more first clock signals.

15. The apparatus according to claim 1, wherein said first serialization element further comprises a re-timing flip-flop that operates on a second edge of said one or more first clock signals.

16. The apparatus according to claim 1, wherein said apparatus implements a bit rate flip-flop configured to re-time the output of said second serialization element.

17. A method for improving efficiency and precision of a data transmission device comprising the steps of:
    generating (i) one or more first control signals, (ii) one or more second control signals, (iii) one or more first clock signals and (iv) a first data signal operating at a first speed in response to (i) an input data signal and (ii) a reference clock signal;
    generating one or more intermediate data signals operating at a second speed using a first serialization element, in response to (i) said one or more first control signals, (ii) said one or more first clock signals and (iii) said first data signal; and
    generating an output data signal operating at a third speed using a second serialization element comprising a multiplexer, in response to (i) said one or more second control signals and (ii) said one or more intermediate data signals operating at a second speed.

18. An apparatus comprising:
    a first circuit configured to generate (i) one or more first control signals, (ii) one or more second control signals, (iii) one or more first clock signals and (iv) a first data signal operating at a first speed in response to (i) an input data signal, (ii) a reference clock signal and (iii) a feedback clock signal;

a second circuit configured to generate one or more intermediate data signals operating at a second speed in response to (i) said one or more first control signals, (ii) said one or more first clock signals and (iii) said first data signal; and a third circuit configured to generate an output data signal operating at a third speed in response to (i) said one or more second control signals and (ii) said one or more intermediate data signals operating at a second speed, wherein said first circuit comprises a fractional rate phase lock loop (PLL) comprising (i) a phase frequency detector configured to generate a third and a fourth control signal in response to said reference clock signal and said feedback clock signal, (ii) a loop filter configured to generate a fifth control signal in response to said third control signal and said fourth control signal, and (iii) a VCO configured to generate said one or more first clock signals in response to said fifth control signal.

* * * * *